United States Patent [19]
Tailliet

[11] Patent Number: 5,812,446
[45] Date of Patent: Sep. 22, 1998

[54] METHOD AND APPARATUS FOR THE PROTECTION OF NON-VOLATILE MEMORY ZONES

[75] Inventor: François Tailliet, Epinay sur Seine, France

[73] Assignee: SGS-Thomson Microelectronics S.A., Saint Genis, France

[21] Appl. No.: 623,044

[22] Filed: Mar. 28, 1996

[30] Foreign Application Priority Data

Mar. 31, 1995 [FR] France .................................. 95 03863

[51] Int. Cl.$^6$ ...................................................... G11C 7/00
[52] U.S. Cl. ........................ 365/185.04; 365/195; 365/196
[58] Field of Search .............................. 365/185.04, 195, 365/196

[56] References Cited

U.S. PATENT DOCUMENTS 5,363,334  11/1994  Alexander et al. ................. 365/185.04
5,559,992   9/1996  Stutz et al. ................................ 365/195
5,592,641   1/1997  Fandrich et al. .................... 365/185.04

FOREIGN PATENT DOCUMENTS

A-0 326 053  8/1989  European Pat. Off. ......... G06F 12/14
94 15320     7/1994  WIPO ............................... G06F 12/14

OTHER PUBLICATIONS

French Search Report from French Patent Application 95 03863, filed Mar. 31, 1995.

Primary Examiner—Son T. Dinh
Attorney, Agent, or Firm—Wolf, Greenfield & Sacks, P.C.; James H. Morris

[57] ABSTRACT

The disclosure relates to integrated circuits and methods in which it is desired to implement a partition of a memory between a protected zone and a non-protected zone, the dimensions of the protected zone being defined by a customer of the memory. A disclosed method avoids the use of special instructions to define these dimensions. The method includes writing sensitive information elements by starting at an address ADP, and ending at an address ADFM dictated by the circuit. The writing in the address ADFM automatically triggers a sequence for storing, in a non-volatile register RV, the first written address, and a sequence for the activation of a system for the protection of the zone between the addresses ADP and ADFM.

35 Claims, 3 Drawing Sheets

METHOD AND APPARATUS FOR THE PROTECTION OF NON-VOLATILE MEMORY ZONES

BACKGROUND OF THE INVENTION

1. Field of the Invention

The invention relates to non-volatile, electrically erasable programmable memories (EEPROMs), and more particularly but not exclusively to EEPROMS designed to be incorporated into chip cards.

2. Discussion of the Related Art

In many applications of electronic circuits using non-volatile memories, it is desirable to prevent access to certain memory zones without preventing access to other memory zones.

One typical example of an application that shall be referred to throughout the following description is the that of a chip card circuit. The chip card circuit, manufactured by the manufacturer, is purchased by a customer for use in a given application in which the chip card circuit is incorporated into a chip card or circuit board. The customer stores operation programs and certain data elements on the chip card, and then places this chip card at the disposal of a user for applications such as the supply of goods or services, control of access, etc. The operation programs and data elements are defined by the customer and recorded or modified solely under control of the customer. Deliberate or accidental modification of the operation programs or the data elements defined by the customer should be prevented. However, other data elements of the memory should remain accessible and modifiable by the user.

It is therefore planned that the EEPROMs will be capable of working in a protected mode, wherein a part of the memory is protected while another part is freely accessible.

Write protection of a zone of the memory prevents modification of data in the zone by the user or an accidental modification caused by parasitic signals in the circuitry (e.g., undesired noise created during a sequence of powering up the circuit) or by errors or instability in operating programs when a microprocessor, whether internal or external to the card, controls the memory.

The manufacturer of the memory circuit often does not have any prior knowledge of the size of memory that has to be protected and of the size of memory that must be left free for the user. Indeed, the respective sizes depend on the application. It is the customer of the memory circuit and not the manufacturer or the final user that defines the sizes. It is desirable to manufacture only one type of memory circuit which is independent of the application envisaged by the customer. If this were not to be the case, the manufacturer would have to produce different types of memories for different customers or different applications, even if the memory circuits were identical in all respects except for the size of the protected zone.

Therefore, conventional memory circuits typically enable a customer to define a part of the memory that has to be protected. The customer then, after having recorded the information to be protected in the part of the memory to be protected, puts the protection system into operation.

For this purpose a special encoded instruction designed for the microprocessor that controls the memory circuit has been used. This instruction enables the storing, in a non-volatile register external to the memory proper, of an information element specifying the memory zone that is protected and the memory zone that is not protected. Sometimes, this information is stored partly in a non-volatile register and partly in the form of hard wiring. For example, the least significant values of a starting address of a protected zone are stored in the non-volatile register and the most significant values of the starting address are stored by connecting one or two external pins of the integrated circuit to either Vcc or to the ground depending on the values of the address bits to be memorized. These approaches are inconvenient for the customer.

In an alternative solution for use in applications wherein no specific microprocessor instruction is available, the protected zone is defined by a sequence of instructions whose combination is normally impossible or very improbable. Thus, it is unlikely for the sequence defining the protected zone to occur accidentally or even intentionally. However, such unlikely occurrences are not impossible and the implementation of this method is inconvenient for the customer wishing to define the protected zone.

It is an object of the present invention to provide an improved method and apparatus for achieving a desired partition of the memory between protected zones and unprotected zones.

SUMMARY OF THE INVENTION

According to an embodiment of the invention, there is proposed a method to achieve a partition of a memory between a protected zone and a non-protected zone, in an integrated memory circuit including means to prevent or permit access to memory addresses depending on whether they are located in the protected zone or in the non-protected zone, respectively, the protected zone being defined by two zone end addresses, one of which is predetermined while the other is to be chosen. The method includes the steps of:

a) writing in the memory at successive addresses in the desired protected zone;

b) automatically writing the first address of the successive addresses in a volatile register;

c) performing a last writing operation at the predetermined address representing an end of the protected zone;

d) making an automatic transfer, to a non-volatile register, of the address contained in the volatile register, during the operation of writing in the predetermined register, the protected zone being thereupon included between the first address written in the non-volatile register and the predetermined address.

In a first embodiment, the address written in the volatile register, as shall be explained further below, is stable throughout the procedure or, alternatively in another embodiment, the volatile register undergoes changes between steps b) and c).

In the first embodiment the customer is not required to set up a special procedure to define a protected zone, either before or after writing the sensitive information elements in the zone to be protected. Rather, the customer simply writes the sensitive information elements to be protected in the memory, and it is quite simply the order of succession of the write addresses that defines the zone which was written to as the protected zone. There are no special zone protection instructions. Only the normal instructions for writing in the memory are performed. This is especially convenient for the customer.

Another embodiment of the invention is directed to a method for partitioning a memory between a protected zone that contains sensitive information elements, and a non-protected zone, in an integrated circuit including means to limit access to the protected zone of the memory, wherein one end of the protected zone is predetermined before partitioning the memory, the other end being initially undetermined. The method includes the step of writing of the sensitive information elements in the addresses of the desired protected zone, the last write operation being done at the address of the predetermined end, and wherein this last write operation automatically activates the storage, in a non-volatile register, of a specific address defined on the basis of the addresses in which the sensitive information elements are written, this specific address defining the other end of the protected zone.

Several variants of implementation are possible according to the invention.

According to another embodiment of the invention, the final predetermined address is the last address ADF of the memory. The customer requires a protected zone between a starting address ADP and the final address ADF. For this purpose, the customer writes the information to be protected in this zone by starting with the address ADP and ending with the address ADF. It is the fact of writing by starting with the address ADP that temporarily stores the address ADP in the circuit. And it is the fact of writing in the address ADF that activates an automatic procedure, which is invisible to the customer, for the permanent storage of the address ADP in a non-volatile register that defines the partition of the memory.

Another embodiment of the invention includes more complicated circuitry. The protected zone is the zone between, firstly, the smallest address used by the customer during the programming in a protected zone and, secondly, the final address of the memory. In this embodiment, between the steps b) and c) defined here above, there is inserted the recurrent step b1. This step b1 includes modifying, at each write operation, of the volatile register in order to place therein the smallest of the address being written and the address contained in the register. When the writing is done in the last address ADF of the memory, or alternatively another predetermined address, the contents of the volatile register are transferred automatically into the non-volatile register. The contents represent the smallest of the addresses at which writing has been done during this operation. The protected zone is defined solely by the operations of writing in this zone.

In another embodiment, the core of the invention is an automatic procedure for the definition of a partition between a protected zone and a non-protected zone, wherein the sole fact of writing the information to be protected defines one end of the protected zone, the other end being predefined and imposed.

This procedure entails the assumption only that one of the ends of the protected zone is predetermined, i.e. that the configuration of the circuit at the time of the operation of partition makes it possible to recognize the reception of a write command at this address to activate the automatic partition.

Another embodiment of the invention is directed to a memory circuit having means adapted to perform the above-described methods.

Another embodiment is directed to an integrated memory circuit including means for limiting access to a protected zone of the memory, the means for limiting having a non-volatile register that stores an end address of the protected zone. The memory circuit further includes means for defining a desired partition of the memory between this protected zone and a non-protected zone, the means for defining having a sequencer, activated automatically by an operation of writing in a predetermined address of the memory, after operations for the writing of information in a series of other addresses of the desired protected zone, in order to carry out the storage, in the non-volatile register, of a specific address defined automatically in the circuit on the basis of the addresses of the series.

BRIEF DESCRIPTION OF THE DRAWINGS

Other features and advantages of the invention shall appear from the following detailed description, made with reference to the drawings.

DETAILED DESCRIPTION

An embodiment of the invention is described hereinbelow with reference to a particular example of a 16-kilobit EEPROM in which at least a first half of the memory is freely accessible and in which a part of a second half of the memory is protected when a protected mode is activated. The size of the protected part of the memory can be defined by the customer when the customer records sensitive information elements in the protected part. By way of example, the protection is a standard write protection.

Reference is made solely to write protection wherein any modification of the contents of a protected zone of the memory is prohibited. However, the invention is transposable to read protection wherein the reading of the protected zone is prohibited, or alternatively to both read and write protection.

Figure 1:
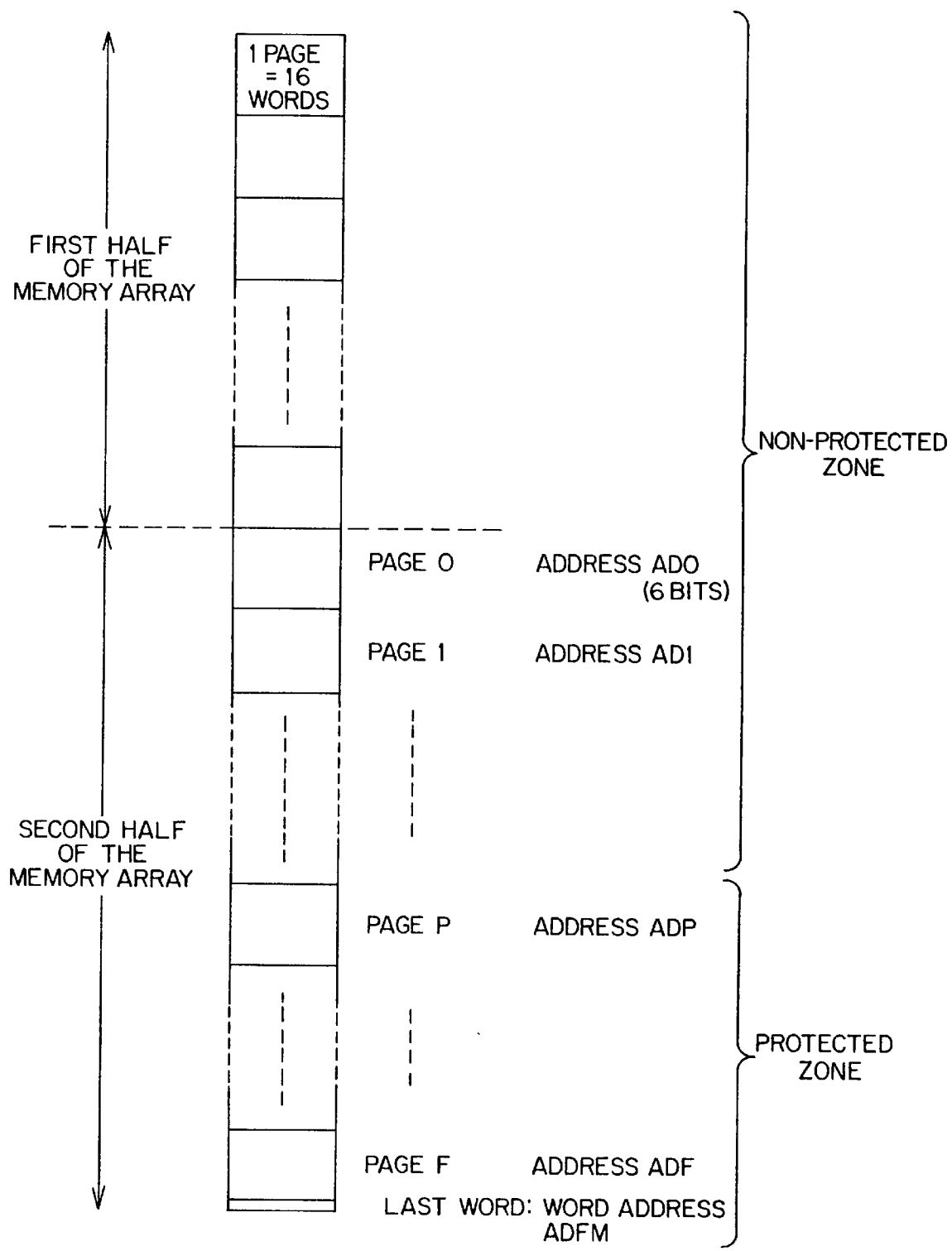
FIG. 1 illustrates a configuration of the memory zones.

According to an embodiment of the invention, the memory is organized in pages of sixteen words of eight bits each, and the protected zone is defined with a resolution of one page and not one word as illustrated in FIG. 1. However, other resolutions may be provided such as a resolution of one word, if desired. The value of using one-page resolution is that the number of address bits that have to be stored to define the ends of the protected zone is limited. Here, the page address is defined by seven bits. The word address is defined by four additional least significant bits.

In the exemplary embodiment shown in FIG. 1, the protected zone is in the second half of the memory. Consequently, the most significant bit of a protected zone end address is predetermined to indicate the second half of the memory and does not need to be memorized. Six bits remain necessary to define a protected zone end address. Therefore, the address considered as a protected zone end address is a page address formed solely by the six bits used to define this address with the resolution of a page. However, other forms of organization are possible.

According to an embodiment of the invention, one of the protected zone end addresses is predetermined. The other protected zone end address is defined directly and automatically by the process of writing sensitive information elements into the memory.

All that the customer needs to do is to record the sensitive information elements in the protected zone. The zone is protected after the operation of writing sensitive information elements into the memory has completed, as shall be explained.

First mode of implementation

According to one embodiment of the invention, one end of the protected zone is predetermined to be the end of the memory itself. The predetermined end address is that of the last page ADF of the memory if the memory is programmable by page, or alternatively that of the last word address ADFM of the memory if the memory is programmable by word.

In connection with choosing the other protected zone end address, the customer chooses the page address ADP on the basis of the sensitive information elements to be protected. The protected zone is then the zone between the page address ADP and the end of the memory, i.e., the page address ADF.

Figure 2:
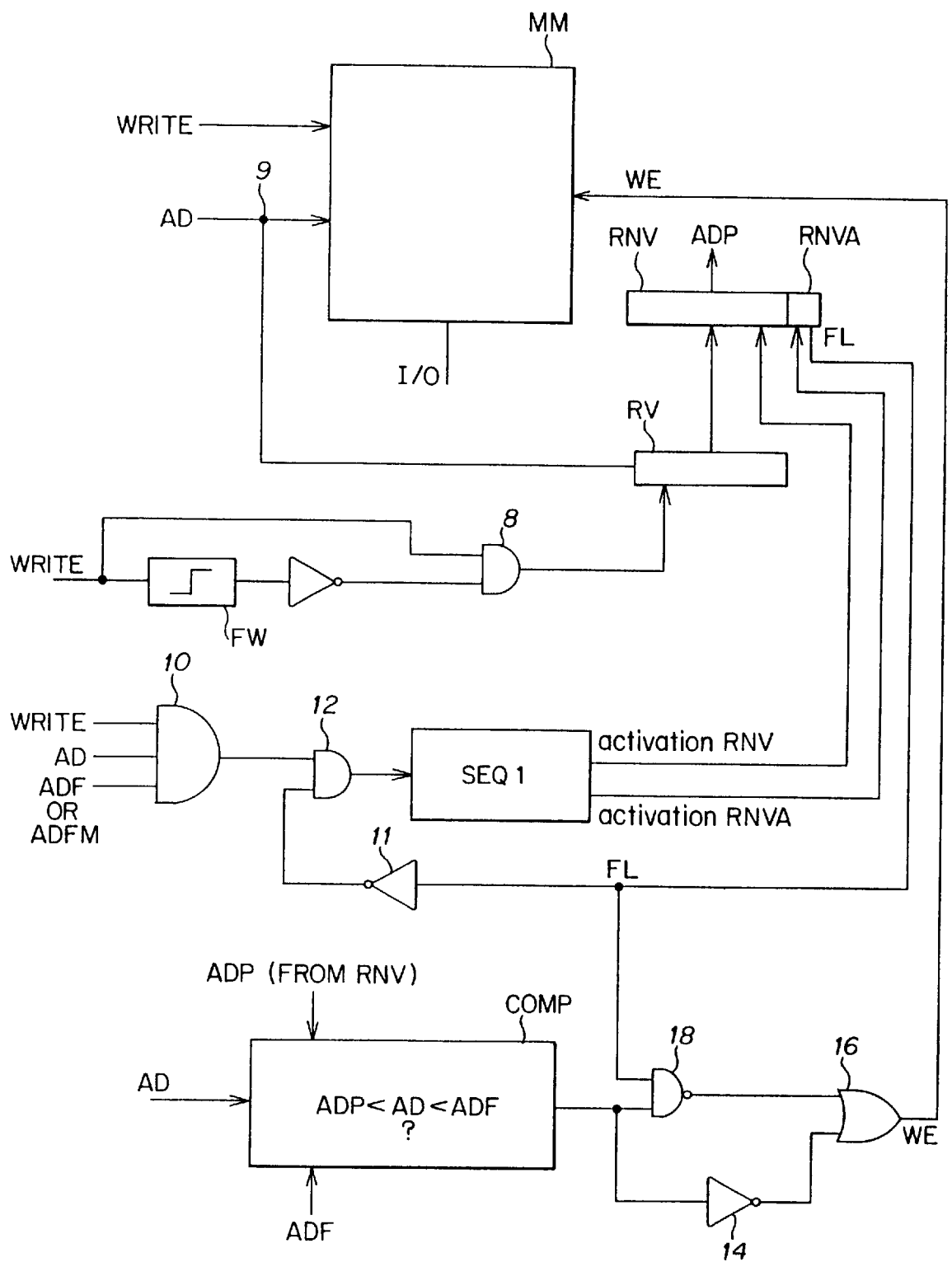
FIG. 2 illustrates an integrated circuit according to an embodiment of the invention.

One illustrative implementation of a circuit that implements this protection scheme is shown in FIG. 2. The customer writes the sensitive information elements in the memory MM, starting with a word at the address ADP corresponding to the start of the protected zone, for it is the first address written that automatically dictates the start of a protected zone. The customer then writes all the sensitive information elements. The customer ends with the writing of a word at the address ADF, which activates the storage of the address ADP in a non-volatile register used as a permanent reference indicating the boundaries of the protected zone to control the access to this zone and allow free access to the rest of the memory.

The circuit for partitioning zones of the memory into a protected zone and a non-protected zone includes a volatile register RV in which the first page address ADP written by the customer is recorded. In the example described, the page address ADP includes six page-address bits (wherein a word address includes 11 address bits). The address ADP remains in the register RV as the customer continues to write sensitive information elements.

The WRITE command received by the memory is used to record the address ADP in the register RV. The register RV is connected to an address line of the memory at a node 9, and receives the page address bits of the current address AD applied to the memory MM. However, so that the contents of the register RV are not modified during the following writing operations, the write control signal for writing in the register RV, which is the WRITE signal itself, is inhibited after the first writing operation. This inhibition is performed by means of a monostable flip-flop circuit FW that provides a non-inhibiting signal at the outset (output at zero) and immediately flips over to provide an inhibiting signal (output at one) after the first write command. An AND gate 8 receives the output (i.e., the inhibiting or non-inhibiting signal) of the flip-flop circuit FW and inhibits any subsequent modification of the contents of the register RV after the first writing operation.

The address recorded in the register RV is therefore the address ADP if the customer follows the normal procedure.

The customer then continues the writing of the sensitive information elements in the addresses of the desired protected zone, between the address ADP and the page address ADF (e.g., the first word of the page at address ADP and the last word of the page at address ADF). The references to word addresses hereinafter are applicable if the memory is programmable by words.

The customer ends with a writing operation at the address ADF, or alternatively ADFM. The partition circuit includes a detector for detecting the writing of sensitive information elements at the address ADF, or alternatively ADFM. This detection activates a sequencer SEQ1 which stores, in a non-volatile register RNV, the address ADP that is temporarily stored in the register RV. This may be done, as shown schematically in FIG. 2, by means of an AND gate 10 that receives the address ADF, or alternatively ADFM, the current address AD (page or word) received by the memory, and the signal WRITE. If there is a writing operation at the address ADF (or ADFM), the gate 10 opens and activates the sequencer SEQ1. However, this activation takes place only if the memory partition operation has not yet taken place. A non-volatile register RNVA which may be formed by an additional compartment of the register RNV contains a non-volatile flag FL, which is initially at zero, indicating that the partition procedure has not yet taken place. If the flag is activated, the sequencer SEQ1 is inhibited. This has been shown by means of an AND gate 12 receiving the inverted output of the register RNVA from inverter 11, and the output of the gate 10.

The sequencer SEQ1 activates the non-volatile flag FL of the register RNVA and transfers the contents of the volatile register RV into the non-volatile register RNV (e.g., six page address bits of the second half of the memory). The partition is then set up.

If the customer has made a mistake, is in the course of performing a test, or for some other reason desires to stop setting up the partition, the customer may prevent the activation of the sequencer SEQ1 by not writing at the address ADF (or ADFM), and by cutting off the supply to the circuit. This returns the circuit to its initial state as if no attempt had been made to set up the partition of the memory zone. The operation then may be started at the beginning.

However, if the customer writes at the address ADF (or ADFM), the partition is set up, and the flag FL is set at 1.

According to another embodiment of the invention, a microprocessor-based partitioning circuit is provided. The circuit includes a microprocessor that receives a series of instructions for writing the first address in the register RV, detecting the writing at the address ADF or ADFM, reading the contents of the volatile register RV, writing these contents in the register RNV, and setting up the flag FL at 1 in the compartment RNVA. Alternatively, this series of instructions can be performed, without any microprocessor, by a wired control circuit of the state machine type.

When the partition is achieved using either of the circuits described above, the circuit works in a protected mode. That is, any address AD received is compared with the stored address ADP in a comparator COMP. If the address is at a lower value (referencing the non-protected zone), a write enable signal WE is transmitted to the memory MM (by the gates 14 and 16) for the performance of a write cycle. However, if the address has a value greater than ADP, i.e., a value between that of the page addresses ADP and ADF, a logic gate 18 enables the inhibition of the signal WE. This inhibition however takes place only if the partition has been previously created. This is checked by the flag RNVA for the activation of the partition. The gate 18 receives the contents FL of the register RNVA. So long as these contents remain at zero, the write enable signal persists for all the addresses of the memory.

It should be understood that the address ADF (or ADFM), which represents the second end of the protected zone and is predetermined, could quite easily be different from the final address of the memory. In particular, the second end of the protected zone could be any predetermined address ADQ (page address for programming by page) or ADQM (word address for programming by word). In this case, however, the programmer who writes the sensitive information elements in the protected zone must know that, as soon as the customer has written in this particular address, the partition is considered to have been formed, the sequencer SEQ1 is active and the protective zone is located between the address ADQ (or ADQM) and the address contained in the volatile register RV at the time of the activation. The customer (or programmer) must therefore take into account when writing the sensitive information elements, the main rule being that the customer (or programmer) should write last in the predetermined address which activates the partition. To implement this, the partitioning circuit can be modified so that the comparator COMP makes an examination to find out whether the current address is between ADP and ADQ to inhibit the write signal WE.

It should be understood that the protected zone can be located not only after the first written address ADP and up to the predetermined address ADQ, but alternatively can be located before the address ADP from a predetermined address identified as ADQ'. In this instance, the customer carries out a programming operation on the basis of the address ADP, and the partitioning process begins when the customer programs the address ADQ' (or ADQ'M). The comparator COMP then inhibits access to the memory when the current address is included between ADQ' and ADP.

Second mode of implementation

Definition of the location of the protected zone may be obtained in ways that are different form the ones discussed above. In particular, the customer does not need to start the writing of the sensitive information elements at a particular address defining one end of the protected zone. A circuit for implementing this alternate embodiment of the present invention is shown in FIG. 3.

In accordance with this embodiment of the invention, the customer writes the sensitive information elements in the protected zone that he chooses by starting anywhere and simply avoiding the programming of the particular address ADQ (or ADQM) that will activate the partition. Here again, the address ADQ or ADQM may be an address pertaining to the end of the memory or the start of the memory or any other predetermined address. According to the embodiment of the invention shown in FIG. 3, rewriting in the volatile register is enabled at each operation of writing in the memory.

The page address that is rewritten at each time in the volatile register RV is the smallest of either the current page address or the page address already contained in the register RV. In other words, if a write operation is performed at an address with a value greater than the address contained in the register, this value is left in the register RV. However, if the writing is done at an address with a lower value, the value of the new page address is written in the register RV. After the customer has written the sensitive information elements, the register RV contains the smallest page address value ADmin used by the customer (or the programmer) to store the sensitive information elements. According to this embodiment, the customer is not bound by having to start programming at the smallest address that the customer will need.

Figure 3:
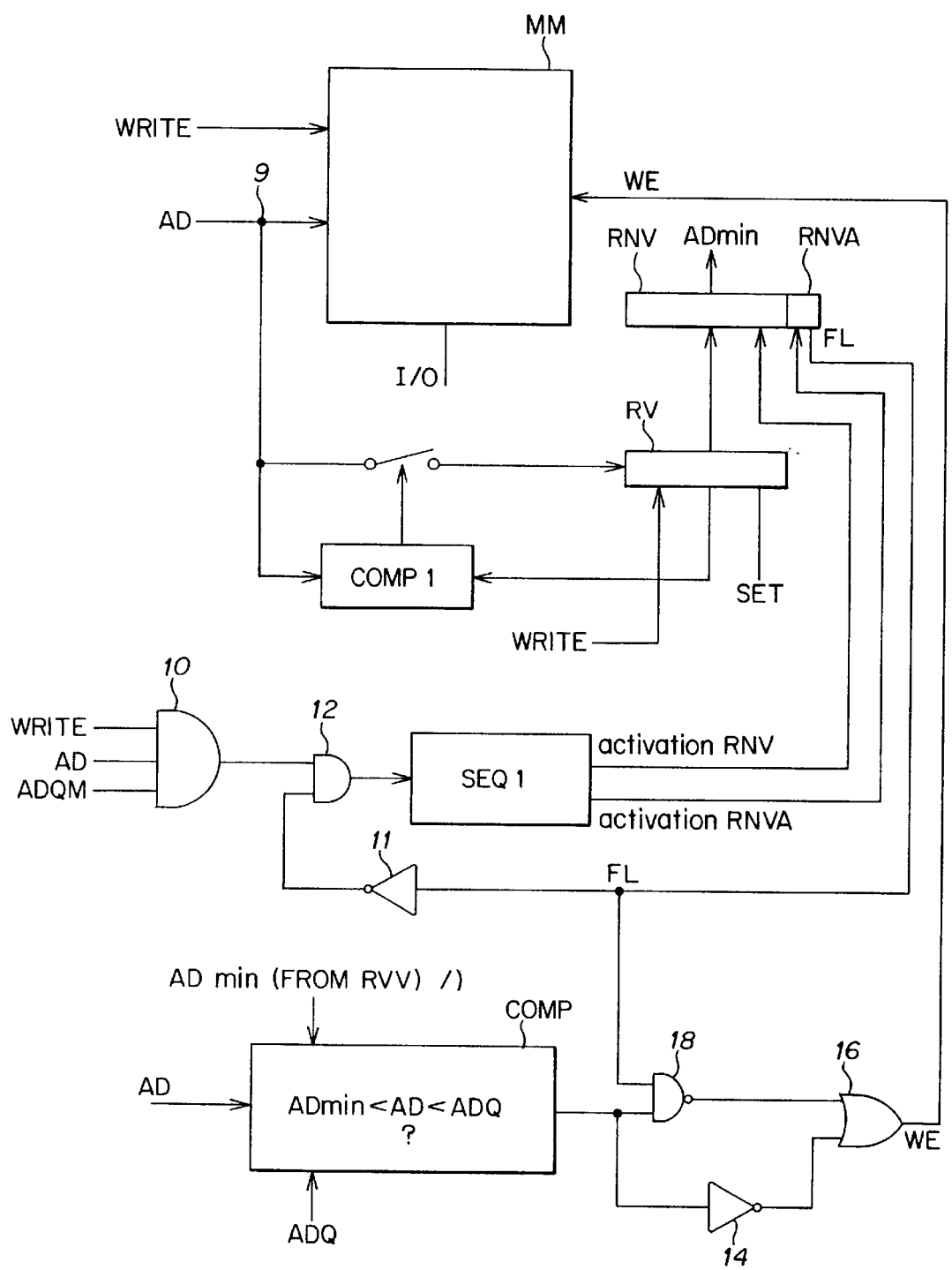
FIG. 3 illustrates a circuit according to an alternative embodiment of the invention.

In the embodiment of the invention shown in FIG. 3, an additional comparator COMP1 receives the current page address (e.g., six AD bits) and the contents of the register RV during the writing of the sensitive information elements, and defines whether the contents of the register must be modified in order to be replaced by a smaller address. A monostable trigger circuit inhibits this comparator during the first comparison if the register is initially at zero, so that a first address is stored in the register before starting the comparisons. Alternatively, the register can be set at an initial maximum value (e.g., a sequence of ones) when the circuit is powered up, and hence before the first write operation. This is represented by a command SET of the register RV, made when the circuit is powered up.

In other respects, the circuit of FIG. 3 works as described with reference to the embodiment of FIG. 2. The variants mentioned with respect to FIG. 2 can be transposed to the embodiment of FIG. 3. The predetermined address that is programmed last to trigger the activation of the partition can be any address ADQ or ADQM other than the last address ADF or ADFM of the memory. Furthermore, the register RV can be filled each time with the greatest, rather than the smallest of the two values between the value already contained in the register and the current address value. In this embodiment, the register RV is set at zero rather than at one by the command SET. The predetermined address ADQ' or ADQ'M is the starting address of the protected zone and not the end address. The last write operation at the predetermined address activates the partition.

The circuits of FIGS. 2 and 3 are provided as schematic examples of circuits for implementing the present invention. These circuits can be modified while still performing the same functions. For example, the registers RNV and RNVA may be words of an extension of the memory MM, i.e., words that may be written and read through addresses that are different from those defining the memory array accessible to the user. In this case, it should be understood that the functions represented by simple connections and elements shown in FIGS. 2 and 3 are obtained, in practice, by more complicated sequencers. Thus, any operation of writing in the memory MM uses a prior reading of the flag FL of the register RNVA, and a reading of the contents of the register RNV. These contents are then used to determine whether write access is permitted. This has been shown schematically in FIGS. 2 and 3 by means of simple logic gates and comparators connected to the registers RNV and RNVA.

Throughout the above description, it has been assumed that there is only one possible value of a predetermined address ADF or ADQ (ADFM or ADQM) in a given circuit. However, it is also possible for a user to define the value ADQ or ADQM himself prior to the above-defined operation of partition. An embodiment of the invention enables this definition to be made by programming, or by any other means. This however places an additional constraint on the customer. It is also possible, for example, to provide for a case where the first operation of writing in any address of the memory defines the predetermined address ADQ, and wherein it is the second writing operation that is considered to be the first writing operation as understood in the entire description given here above. The circuits of FIGS. 2 and 3 are easily be adapted to this additional constraint.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for partitioning a memory into a protected zone for storing sensitive information elements, and a non-protected zone, the protected zone having an initially undetermined size and a first end address that is predetermined, the memory being coupled to a circuit that limits access to the protected zone of the memory, the method comprising the steps of:

performing a plurality of write operations that write the sensitive information elements in the memory at addresses included in the protected zone, a last of the plurality of write operations being performed at the first end address of the protected zone; and automatically storing, in response to the last write operation, a second end address of the protected zone in a non-volatile register, the second end address being defined based upon the addresses at which the sensitive information elements were written.

2. The method according to claim 1, wherein the step of performing the plurality of write operations includes a step of:

writing a sensitive information element to the second end address before writing to any other address included in the protected zone.

3. The method according to claim 1, wherein the step of automatically storing the second end address includes a step of:

defining the second end address to be equal to one of the lowest address and the highest address at which the plurality of write operations is performed.

4. A method for partitioning a memory into a protected zone and a non-protected zone, the memory being coupled to a circuit that respectively prevents and permits access to addresses within the memory that are located in the protected zone and in the non-protected zone, the protected zone being defined by a first end address and a second end address, the first end address being predetermined, the second end address being initially undetermined, the method comprising the steps of:

(A) performing a plurality of write operations that write information in the memory at a corresponding plurality of addresses within the protected zone;

(B) automatically writing a first of the plurality of addresses as contents of a volatile register, the first of the plurality of addresses corresponding to a first of the plurality of write operations performed before any other of the plurality of write operations;

(C) performing a last write operation at the first end address; and (D) automatically transferring the contents of the volatile register to a non-volatile register in response to the performance of the last write operation, the transferred contents defining the second end address of the protected zone.

5. The method according to claim 4, further comprising a step of, for each one of the plurality of write operations:

overwriting the contents of the volatile register with a next address corresponding to the one of the plurality of write operations when a difference between the next address and the first end address exceeds that between the contents of the volatile register and the first end address.

6. An integrated circuit for controlling the operation of a memory, the integrated circuit comprising:

limiting means for limiting access to a protected zone of the memory, the limiting means including a non-volatile register to store a first end address of the protected zone; and partitioning means for partitioning the memory between the protected zone and a non-protected zone, the partitioning means including a sequencer, activated automatically when a write operation is performed at a predetermined address of the memory following write operations of sensitive information elements at a series of other addresses in the protected zone, the sequencer being adapted to store, in the non-volatile register of the limiting means, the first end address defined based on the series of other addresses.

7. The integrated circuit of claim 6, wherein the partitioning means further includes a volatile register, and wherein the sequencer includes means for transferring contents of the volatile register into the non-volatile register, the means for transferring being adapted to store, in the non-volatile register, a first write operation address at which a first of the series of write operations is performed before any other of the series of write operations.

8. The integrated circuit of claim 7, further comprising means for replacing the contents of the volatile register with a current write address value when the current write address value is lower than a value defined by the contents of the volatile register.

9. The integrated circuit of claim 7, further comprising means for replacing the contents of the volatile register with a current write address value when the current write address value is higher than a value defined by the contents of the volatile register.

10. The integrated circuit of claim 6, further comprising:

a non-volatile register cell, programmed by the sequencer, to contain a non-volatile flag indicating that the desired partition of the memory between the protected zone and the non-protected zone is in service; and means for inhibiting writing in the protected zone when the flag is activated.

11. A method for partitioning a memory into a protected zone and a non-protected zone, the method comprising the steps of:

receiving a plurality of memory addresses respectively corresponding to a plurality of write operations that write information to the memory;

automatically storing at least one of the plurality of memory addresses in a storage element; and defining, in response to receiving a predetermined one of the plurality of memory addresses, the protected zone as being a portion of the memory from a first boundary of the protected zone based on the at least one of the plurality of memory addresses automatically stored in the storage element to a second boundary of the protected zone, the second boundary being predetermined.

12. The method of claim 11, wherein the step of automatically storing includes a step of storing an initial memory address as contents of the storage element, the initial memory address corresponding to an initial write operation that writes to the memory before any other of the plurality of write operations.

13. The method of claim 12, wherein the step of defining includes a step of setting the first boundary of the protected zone to be the initial memory address.

14. The method of claim 13, wherein the step of setting includes a step of disabling the storage element from being overwritten after the initial memory address is stored as the contents of the storage element.

15. The method of claim 12, wherein the step of defining includes a step of setting the first boundary of the protected zone to be a furthest address of the plurality of memory addresses that is furthest from the predetermined one of the plurality of memory addresses.

16. The method of claim 15, wherein the step of automatically storing further includes a step of replacing the contents of the storage element with a next memory address when a difference between the next memory address and the predetermined one of the plurality of memory addresses is higher than that between the contents of the storage element and the predetermined one of the plurality of memory addresses.

17. The method of claim 11, wherein the second boundary is based on the predetermined one of the plurality of memory addresses, and wherein the step of defining includes a step of:

saving a memory address, in a register, as the first boundary in response to a write operation to the predetermined one of the plurality of memory addresses.

18. An apparatus for partitioning a memory into a protected zone and a non-protected zone, the apparatus comprising:

an address terminal that receives a plurality of memory addresses respectively corresponding to a plurality of write operations that write information to the memory;

a storage element, coupled to the address terminal, that stores at least one of the plurality of memory addresses; and a partitioning circuit having a first input coupled to the address terminal, a second input coupled to the storage element, and an output that, in response to receiving a predetermined one of the plurality of memory addresses, defines the protected zone as being a portion of the memory from a first boundary of the protected zone based on the at least one of the plurality of memory addresses stored in the storage element to a second boundary of the protected zone, the second boundary being predetermined.

19. The apparatus of claim 18, wherein the storage element is adapted to store an initial memory address as contents of the storage element, the initial memory address corresponding to an initial write operation that writes to the memory before any other of the plurality of write operations.

20. The apparatus of claim 19, wherein the partitioning circuit includes setting circuitry that sets the first boundary of the protected zone to be the initial memory address.

21. The apparatus of claim 20, wherein the partitioning circuit further includes disabling circuitry that disables the storage element from being overwritten after the initial memory address is stored as the contents of the storage element.

22. The apparatus of claim 19, wherein the partitioning circuit includes a sequencer that sets the first boundary of the protected zone to be a furthest address of the plurality of memory addresses that is furthest from the predetermined one of the plurality of memory addresses.

23. The apparatus of claim 22, wherein the partitioning circuit further includes a comparator and a switch, each of the comparator and the switch being coupled to the storage element and the address terminal, to replace the contents of the storage element with a next memory address when a difference between the next memory address and the predetermined one of the plurality of memory addresses is higher than that between the contents of the storage element and the predetermined one of the plurality of memory addresses.

24. The apparatus of claim 18, wherein the second boundary is based on the predetermined one of the plurality of memory addresses, and wherein the step of defining includes:

circuitry that saves a memory address, in a register, as the first boundary in response to a write operation to the predetermined one of the plurality of memory addresses.

25. An apparatus for partitioning a memory into a protected zone and a non-protected zone, the apparatus comprising:

an address terminal that receives a plurality of memory addresses respectively corresponding to a plurality of write operations that write information to the memory;

a storage element coupled to the address terminal, that stores at least one of the plurality of memory addresses; and partitioning means, coupled to the address terminal and the storage element, for defining, in response to receiving a predetermined one of the plurality of memory addresses, the protected zone as being a portion of the memory from a first boundary of the protected zone based on the at least one of the plurality of memory addresses stored in the storage element to a second boundary of the protected zone, the second boundary being predetermined.

26. The apparatus of claim 25, wherein the storage element is adapted to store an initial memory address as contents of the storage element, the initial memory address corresponding to an initial write operation that writes to the memory before any other of the plurality of write operations.

27. The apparatus of claim 26, wherein the partitioning means includes means for setting the first boundary of the protected zone to be the initial memory address.

28. The apparatus of claim 27, wherein the partitioning means further includes means for disabling the storage element from being overwritten after the initial memory address is stored as the contents of the storage element.

29. The apparatus of claim 26, wherein the partitioning means includes means for setting the first boundary of the protected zone to be a furthest address of the plurality of memory addresses that is furthest from the predetermined one of the plurality of memory addresses.

30. The apparatus of claim 29, wherein the partitioning means further includes means for replacing the contents of the storage element with a next memory address when a difference between the next memory address and the predetermined one of the plurality of memory addresses is higher than that between the contents of the storage element and the predetermined one of the plurality of memory addresses.

31. The apparatus of claim 25, wherein the second boundary is based on the predetermined one of the plurality of memory addresses, and wherein the step of defining includes:

means for saving a memory address, in a register, as the first boundary in response to a write operation to the predetermined one of the plurality of memory addresses.

32. A method for partitioning a memory into a protected zone for storing information, and a non-protected zone, the protected zone having an initially undetermined size and a first end address that is predetermined, the method comprising the steps of:

performing a plurality of write operations that write the information in the memory at addresses included in the protected zone; and storing, in response to a particular operation that accesses an address of the protected zone, a second end address of the protected zone in a register, the protected zone being defined by the first and second end addresses.

33. The method of claim 32, wherein the step of storing includes a step of saving the second end address in the register in response to a write operation to the first end address.

34. A method for partitioning a memory into a protected zone and a non-protected zone, the method comprising the steps of:

receiving a plurality of memory addresses respectively corresponding to a plurality of write operations that write information to the memory;

storing at least one of the plurality of memory addresses in a storage element; and defining the protected zone as a portion of the memory that extends from a first boundary of the protected zone based on the at least one of the plurality of memory addresses stored in the storage element to a second boundary that is predetermined.

35. The method of claim 34, wherein the step of defining includes a step of storing an address of the first boundary in an area of memory in response to an operation accessing the second boundary.

* * * * *